(12) United States Patent
McClenehan et al.

(10) Patent No.: US 12,248,041 B2
(45) Date of Patent: Mar. 11, 2025

(54) VAPOR CELL DETECTION SYSTEM

(71) Applicant: NORTHROP GRUMMAN SYSTEMS CORPORATION, Falls Church, VA (US)

(72) Inventors: August John McClenehan, Calabasas, CA (US); Steven Ryan Jefferts, Chatsworth, CA (US); Vyacheslav Lebedev, Redondo Beach, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 178 days.

(21) Appl. No.: 18/297,899

(22) Filed: Apr. 10, 2023

(65) Prior Publication Data

US 2023/0417848 A1 Dec. 28, 2023

Related U.S. Application Data

(60) Provisional application No. 63/332,905, filed on Apr. 20, 2022.

(51) Int. Cl.
*G01R 33/26* (2006.01)
*G01R 33/00* (2006.01)

(52) U.S. Cl.
CPC ......... *G01R 33/26* (2013.01); *G01R 33/0052* (2013.01)

(58) Field of Classification Search
CPC ............... G01R 33/26; G01R 33/0052; G01N 2021/6482; G01N 21/6404
See application file for complete search history.

(56) References Cited

U.S. PATENT DOCUMENTS

| 5,227,722 A * | 7/1993 | Kostyk ................... G01R 33/26 324/304 |
| 10,965,298 B2 | 3/2021 | Gerginov |
| 2012/0022922 A1 | 9/2012 | Balet et al. |
| 2017/0104426 A1 * | 4/2017 | Mills ................... H01L 31/0549 |

(Continued)

FOREIGN PATENT DOCUMENTS

| JP | 2018-132348 A | 8/2021 |
| KR | 19990016397 A | 3/1999 |

OTHER PUBLICATIONS

International Search Report for corresponding PCT/US2023/018052, mailed Jul. 24, 2023.

*Primary Examiner* — Alvaro E Fortich
(74) *Attorney, Agent, or Firm* — Tarolli, Sundheim, Covell & Tummino LLP

(57) ABSTRACT

One example includes a vapor cell. The cell includes a transparent enclosure and alkali metal atoms enclosed within the transparent enclosure. The alkali metal atoms can be configured to be stimulated from a first energy state to a second energy state in response to an optical beam provided through the vapor cell and to emit fluorescent light in response to energy of the alkali metal atoms decaying from the second energy state to the first energy state. The cell further includes a reflective coating that is provided on an exterior surface of the transparent enclosure to surround the vapor cell to provide a reflective interior surface with respect to the transparent enclosure of the vapor cell to reflect the fluorescent light. The reflective coating can include a detection window configured to facilitate escape of the fluorescent light from the vapor cell for optical detection.

20 Claims, 3 Drawing Sheets

(56) References Cited

U.S. PATENT DOCUMENTS

| | | | | |
|---|---|---|---|---|
| 2017/0331485 A1* | 11/2017 | Gobet | ........................ | G04F 5/14 |
| 2018/0364096 A1* | 12/2018 | McDonald | ................ | G01J 1/42 |
| 2020/0002828 A1* | 1/2020 | Mills | ........................ | H02S 40/42 |
| 2021/0004846 A1 | 2/2021 | Anderson et al. | | |
| 2021/0015679 A1 | 5/2021 | Jeong et al. | | |

* cited by examiner

VAPOR CELL DETECTION SYSTEM

CROSS REFERENCE TO RELATED APPLICATION

This application claims priority from U.S. Provisional Patent Application No. 63/332,905, filed 20 Apr. 2022, which is incorporated herein by reference in its entirety.

TECHNICAL FIELD

The present invention relates generally to atomic systems, and specifically to a vapor cell detection system.

BACKGROUND

Atomic systems that implement atomic interaction with optical beams are implemented for a variety of applications, such as sensors and atomic clocks. As an example, one or more optical beams can be provided through a vapor cell that includes an alkali metal vapor, such that excitation of the alkali metal vapor atoms can exhibit an optical response based on amplitude, frequency, and/or polarization of the optical beam(s). The optical response of a given atomic system can thus be indicative of a parameter (e.g., time, rotation, magnetic field, electric field, acceleration) to a highly accurate degree. Some atomic systems, such as atomic clocks, implement detection of fluorescent light associated with energy decay of the alkali metal atoms from an excited energy state as the optical response, such as to indicate a frequency of an optical beam that excited the alkali metal atoms to the excited energy state. Such fluorescent light can be captured by a photodetector, such that the intensity of the fluorescent light can be monitored to lock a frequency of the laser that provides the optical beam in a feedback manner.

SUMMARY

One example includes a vapor cell. The cell includes a transparent enclosure and alkali metal atoms enclosed within the transparent enclosure. The alkali metal atoms can be configured to be stimulated from a first energy state to a second energy state in response to an optical beam provided through the vapor cell and to emit fluorescent light in response to energy of the alkali metal atoms decaying from the second energy state to the first energy state. The cell further includes a reflective coating that is provided on an exterior surface of the transparent enclosure to surround the vapor cell to provide a reflective interior surface with respect to the transparent enclosure of the vapor cell to reflect the fluorescent light. The reflective coating can include a detection window configured to facilitate escape of the fluorescent light from the vapor cell for optical detection.

Another example includes a method for forming a vapor cell. The method includes fabricating a transparent enclosure and filling the transparent enclosure with alkali metal vapor. The method also includes sealing the transparent enclosure to enclose the alkali metal vapor within the transparent enclosure. The method further includes providing a reflective coating on an exterior surface of the transparent enclosure to surround the vapor cell to provide a reflective interior surface with respect to the transparent enclosure of the vapor cell to reflect fluorescent light in an interior of the transparent enclosure.

Another example includes an atomic system. The system includes a laser configured to generate an optical beam. The system also includes a vapor cell. The vapor cell includes a transparent enclosure and alkali metal atoms enclosed within the transparent enclosure. The vapor cell also includes a reflective coating that is provided on an exterior surface of the transparent enclosure to surround the vapor cell to provide a reflective interior surface with respect to the transparent enclosure of the vapor cell. The reflective coating includes a detection window. The system also includes optics configured to provide the optical beam through the vapor cell to stimulate the alkali metal atoms from a first energy state to a second energy state, such that the alkali metal atoms emit fluorescent light in response to energy of the alkali metal atoms decaying from the second energy state to the first energy state. The reflective interior surface can be configured to reflect the fluorescent light within the transparent enclosure. The system further includes a detection system further comprising a photodetector arranged to monitor an intensity of the fluorescent light escaping the transparent enclosure via the detection window.

DETAILED DESCRIPTION

The present invention relates generally to atomic systems, and specifically to a vapor cell detection system. The vapor cell detection system includes a vapor cell that includes a transparent enclosure (e.g., glass). As an example, the transparent enclosure can be arranged as a cylindrical tube having a round (e.g., circular) cross-section relative to a central longitudinal axis. The transparent enclosure is filled with a vapor of alkali metal (e.g., cesium) that is stimulated (e.g., from a ground state to a first excited energy state) by an optical beam provided through the vapor cell. In response to the excitation to a higher energy state, the energy of the alkali metal atoms can decay back to the ground state, resulting in the emission of fluorescent light. The intensity of the fluorescent light can be monitored for a variety of purposes, such as to detect a frequency of the optical beam and/or to lock the frequency of the optical beam in a feedback manner.

The vapor cell can further include a reflective coating that surrounds the transparent enclosure, such that a reflective interior surface of the reflective coating is in contact with an outer surface of the transparent enclosure. Therefore, the fluorescent light can be reflected from the reflective interior surface within the vapor cell. The reflective coating can be absent from a portion of the transparent enclosure to provide a detection window. The vapor cell detection system can include a photodetector that is arranged proximal to the detection window. Based on the internal reflection of the fluorescent light, the reflected rays of the fluorescent light can also be emitted from the detection window, resulting in a larger proportion of the fluorescent light being incident on the photodetector. Furthermore, the atomic system can be arranged such that the optical beam can be provided offset from and parallel to the central longitudinal axis. As a result, the rays of the fluorescent light are not retroreflected within the vapor cell, but instead continue to be reflected in the vapor cell until they are emitted from the detection window. Accordingly, the signal-to-noise-ratio (SNR) of the detection of the fluorescent light can be greatly improved in the vapor cell detection system described herein, as opposed to a typical vapor cell detection system.

Figure 1:
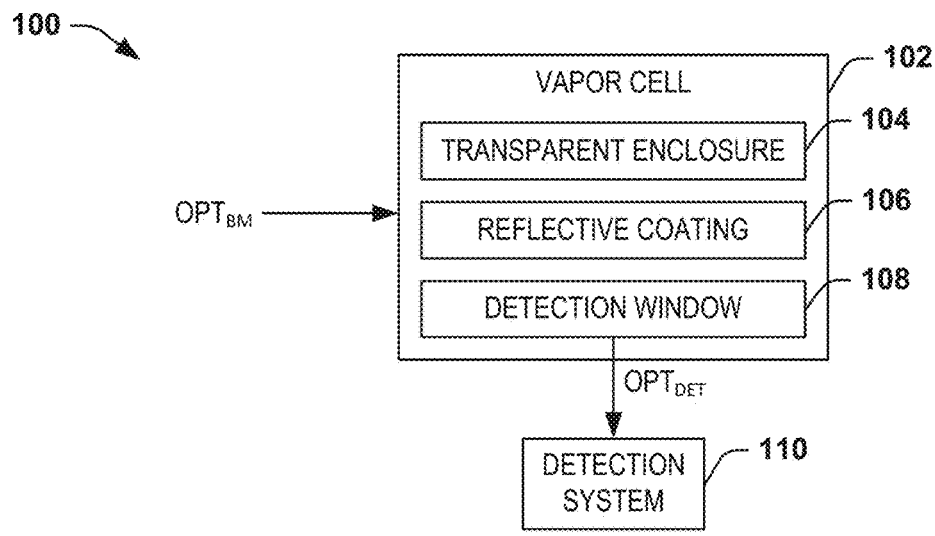
FIG. 1 illustrates an example of a vapor cell detection system.

FIG. 1 illustrates an example of a vapor cell detection system 100. The vapor cell detection system 100 can be implemented in any of a variety of atomic applications that implement detection of fluorescent light, demonstrated in the example of FIG. 1 as an optical signal $OPT_{DET}$. For example, the vapor cell detection system 100 can be implemented in an atomic clock system.

The vapor cell detection system 100 includes a vapor cell 102 that includes a transparent enclosure 104 that can be formed from a variety of transparent materials (e.g., glass). As an example, the transparent enclosure 104 can be arranged as a cylindrical tube having a round (e.g., circular or oval) cross-section relative to a central longitudinal axis. However, the tube that forms the transparent enclosure 104 can have other cross-sectional shapes (e.g., square, rectangular, triangular, etc.). The transparent enclosure 104 is filled with a vapor of alkali metal (e.g., cesium). For example, the alkali metal atoms can be stimulated (e.g., from a ground state to a first excited energy state) by an optical beam $OPT_{BM}$ that is provided through the vapor cell 102. As an example, the optical beam $OPT_{BM}$ can be generated from a laser that is part of an associated atomic system in which the vapor cell detection system 100 is included. As described in further detail herein, the optical beam $OPT_{BM}$ can be provided through the vapor cell 102 via optics. In response to the excitation to a higher energy state, the energy of the alkali metal atoms can decay back to the ground state, resulting in the emission of the fluorescent light $OPT_{DET}$. As described in greater detail herein, the intensity of the fluorescent light $OPT_{DET}$ can be monitored for a variety of purposes, such as to detect a frequency of the optical beam $OPT_{BM}$ and/or to lock the frequency of the optical beam $OPT_{BM}$ in a feedback manner.

In the example of FIG. 1, the vapor cell 102 can include a reflective coating 106 that surrounds the transparent enclosure 104. The reflective coating 106 can thus provide a highly reflective interior surface in contact with an outer surface of the transparent enclosure 104. As a result of the highly reflective interior surface of the reflective coating 106, the fluorescent light $OPT_{DET}$ resulting from the energy decay of the alkali metal atoms can be reflected within the vapor cell 102, as opposed to being transmissive through the transparent walls of the transparent enclosure 104.

As an example, the reflective coating 106 can be formed from a dielectric material. For example, the dielectric material can be selected as a material that is substantially transparent with respect to the frequency of the optical beam $OPT_{BM}$, but highly reflective with respect to the fluorescent light $OPT_{DET}$. Therefore, the optical beam $OPT_{BM}$ can pass through the reflective coating 106 into and out of the vapor cell 102 with substantially no optical losses (e.g., substantially no reflection or refraction), and can thus be unaffected by the reflective coating 106. For example, the optical beam $OPT_{BM}$ can have a wavelength of approximately 822 nm, such as to stimulate cesium from a I6S, F=4> state to a IBS, F=4> state based on a two-photon double pass through the vapor cell 102, as described in greater detail herein. However, the fluorescent light $OPT_{DET}$ can have a wavelength of approximately 459.3 nm based on a decay from a I7P> state (e.g., after losing a photon of infrared light) back down to the I6S, F=4> state. Therefore, the reflective coating 106 can be formed from a dielectric material that is transparent with respect to a range of frequencies that includes the 822 nm wavelength optical beam $OPT_{BM}$, but is highly reflective with respect to a range of frequencies that includes the 459.3 nm wavelength fluorescent light $OPT_{DET}$. As another example, the reflective coating 106 can be formed with a small window to facilitate entry of the optical beam $OPT_{BM}$ into the vapor cell 102 and a small window to facilitate exit of the optical beam $OPT_{BM}$ from the vapor cell 102.

In the example of FIG. 1, the vapor cell 102 further includes a detection window 108 corresponding to an absence of the reflective coating 106 from a portion of the transparent enclosure 104. Therefore, the detection window 108 corresponds to an aperture through which the fluorescent light $OPT_{DET}$ can propagate through the transparent enclosure 104 to escape the vapor cell 102. The vapor cell detection system 100 further includes a photodetector (e.g., photodiode) 110 that is arranged proximal to the detection window 108 that is configured to receive the fluorescent light $OPT_{DET}$.

Based on the reflection of the fluorescent light $OPT_{DET}$ in the interior of the vapor cell 102 via the reflective coating 106, both the direct rays of the fluorescent light $OPT_{DET}$ and the reflected rays of the fluorescent light $OPT_{DET}$ can be emitted from the detection window 108. Additionally, as described above, the transparent enclosure 104 can be arranged as a cylindrical tube having a round (e.g., circular or oval) cross-section relative to a central longitudinal axis. Therefore, the optical beam $OPT_{BM}$ can be arranged to be provided offset from and parallel to the central longitudinal axis. As a result, the rays of the fluorescent light $OPT_{DET}$ are not retroreflected within the vapor cell 102, but instead continue to be reflected in the vapor cell 102 until they are emitted from the detection window 108.

Accordingly, a much larger proportion of the fluorescent light $OPT_{DET}$ can be incident on the photodetector 110 than a typical vapor cell detection system. For example, in a typical vapor cell detection system that does not include any internally reflective coating, only direct rays of the fluorescent light are incident on the photodetector, with all other direct rays propagating through the remaining surfaces of the respective vapor cell and are lost to detection. However, by reflecting the rays of the fluorescent light $OPT_{DET}$ from the internal surface of the vapor cell 102 via the reflective coating 106, the signal-to-noise-ratio (SNR) of the detection of the fluorescent light $OPT_{DET}$ by the photodetector 110 can be greatly improved in the vapor cell detection system 100 described herein.

Figure 2:
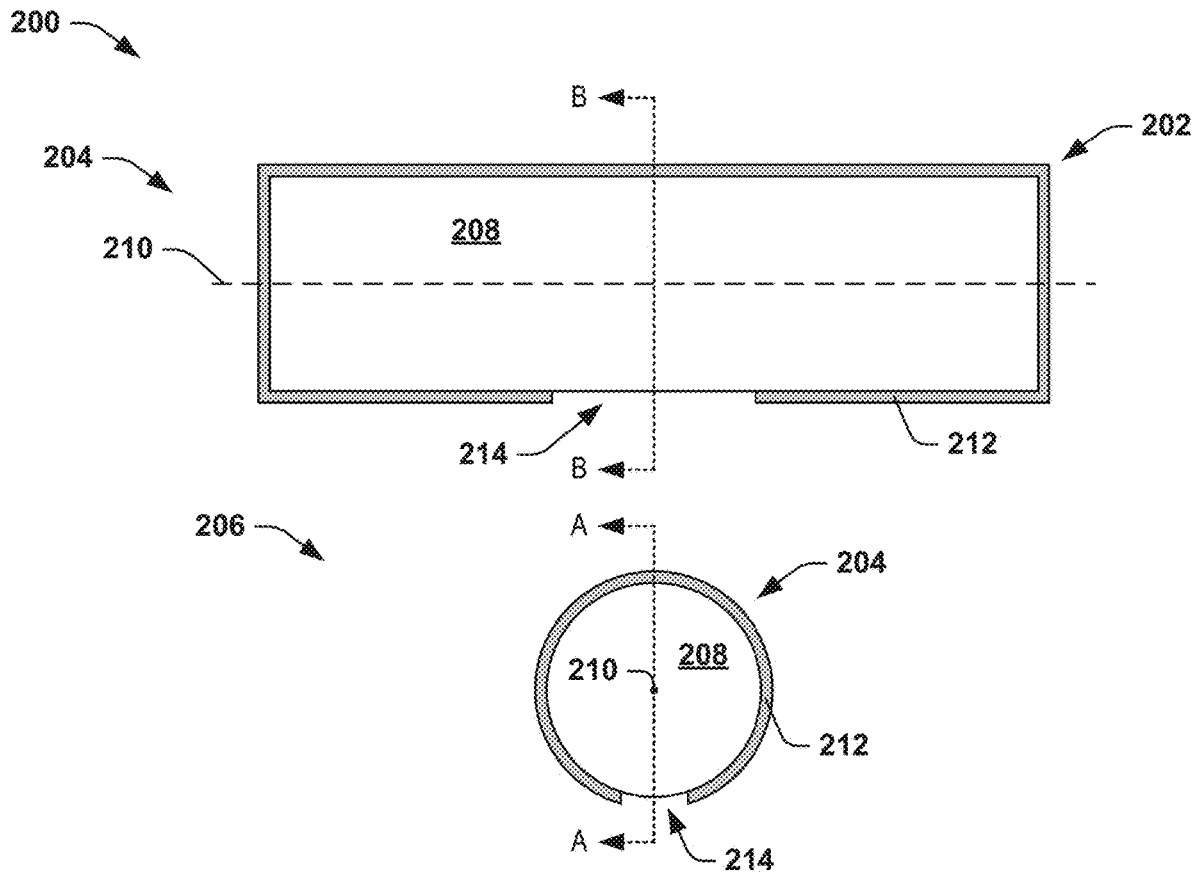
FIG. 2 illustrates an example diagram of a vapor cell.

FIG. 2 illustrates an example diagram 200 of a vapor cell 202. The vapor cell 202 is demonstrated in a first view 204 corresponding to a cross-sectional view taken along "A", and in a second view 206 corresponding to a cross-sectional view taken along "B". The vapor cell 202 can correspond to the vapor cell 102 in the example of FIG. 1. Therefore, reference is to be made to the example of FIG. 1 in the following description of the example of FIG. 2.

The vapor cell 202 includes a transparent enclosure 208 that can be formed from a variety of transparent materials (e.g., glass). In the example of FIG. 2, the transparent enclosure 208 is arranged as a cylindrical tube having a circular cross-section relative to a central longitudinal axis 210. The transparent enclosure 208 is filled with a vapor of alkali metal (e.g., cesium). As described above in the example of FIG. 1, the alkali metal atoms can be stimulated (e.g., from a ground state to a first excited energy state) by the optical beam $OPT_{BM}$ that is provided through the vapor cell 202, and emits the fluorescent light $OPT_{DET}$ in response to decay of the energy of the alkali metal atoms back to the ground state.

In the example of FIG. 2, the vapor cell 202 includes a reflective coating 212 that surrounds the transparent enclosure 208. As an example, the reflective coating 212 can be formed from a dielectric material that can be substantially transparent with respect to the frequency of the optical beam $OPT_{BM}$ but highly reflective with respect to the fluorescent light $OPT_{DET}$. As another example, the reflective coating 212 can be formed with a small window to facilitate entry of the optical beam $OPT_{BM}$ into the vapor cell 202 and a small window to facilitate exit of the optical beam $OPT_{BM}$ from the vapor cell 202. The reflective coating 212 can thus provide a highly reflective interior surface in contact with an outer surface of the transparent enclosure 208. As a result of the highly reflective interior surface of the reflective coating 212, the fluorescent light $OPT_{DET}$ resulting from the energy decay of the alkali metal atoms can be reflected within the vapor cell 202, as opposed to being transmissive through the transparent walls of the transparent enclosure 208.

The vapor cell 202 further includes a detection window 214 corresponding to an absence of the reflective coating 212 from a portion of the transparent enclosure 208. Therefore, the detection window 214 corresponds to an aperture through which the fluorescent light $OPT_{DET}$ can propagate through the transparent enclosure 208 to escape the vapor cell 202. In the example of FIG. 2, the detection window 214 is demonstrated on a lateral side of the vapor cell 202, approximately centered on a midpoint of the length of the vapor cell 202. However, other locations and sizes of the detection window 214 are possible, as described herein.

Figure 3:
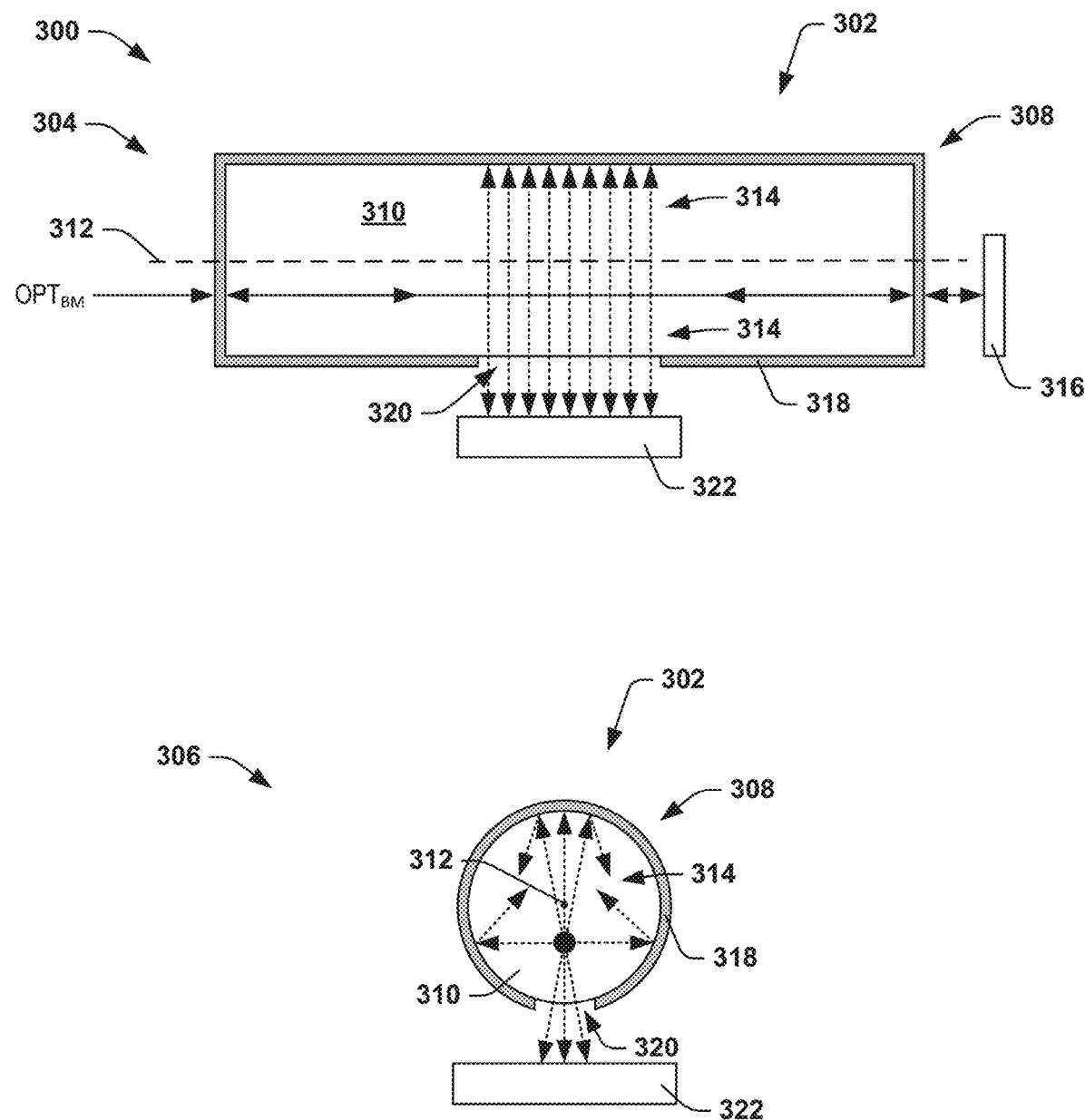
FIG. 3 illustrates an example diagram of a vapor cell detection system.

FIG. 3 illustrates an example diagram 300 of a vapor cell detection system 302. The vapor cell detection system 302 is demonstrated in a first view 304 and in a second view 306 corresponding to the respective cross-sectional views demonstrated in the example of FIG. 2. The vapor cell detection system 302 can correspond to the vapor cell detection system 100 in the example of FIG. 1. The vapor cell detection system 302 includes a vapor cell 308 that can correspond to the vapor cell 202 in the example of FIG. 2. Therefore, reference is to be made to the examples of FIGS. 1 and 2 in the following description of the example of FIG. 3.

The vapor cell 308 includes a transparent enclosure 310 that can be formed from a variety of transparent materials (e.g., glass). In the example of FIG. 3, the transparent enclosure 310 is arranged as a cylindrical tube having a circular cross-section relative to a central longitudinal axis 312. The transparent enclosure 310 is filled with a vapor of alkali metal (e.g., cesium). As described above in the example of FIG. 1, the alkali metal atoms can be stimulated (e.g., from a ground state to a first excited energy state) by the optical beam $OPT_{BM}$ that is provided through the vapor cell 308, and emits fluorescent light, demonstrated in the example of FIG. 3 at 314, in response to decay of the energy of the alkali metal atoms back to the ground state. In the example of FIG. 3, the optical beam $OPT_{BM}$ is provided through the vapor cell 308 parallel to and offset from the central longitudinal axis 312, and is retroreflected back through the vapor cell 308 by a mirror 316. Therefore, the optical beam $OPT_{BM}$ propagates back through the vapor cell 308 in an antiparallel and collinear manner. As a result, the alkali metal in the vapor cell 308 can be stimulated by two photons to be excited from the first energy state to the second energy state. The fluorescent light 314 can thus be emitted based on a decay of the energy of the alkali metal atoms back to the first energy state.

In the example of FIG. 3, the vapor cell 308 includes a reflective coating 318 that surrounds the transparent enclosure 310. As an example, the reflective coating 318 can be formed from a dielectric material that can be substantially transparent with respect to the frequency of the optical beam $OPT_{BM}$ but highly reflective with respect to the fluorescent light 314. As another example, the reflective coating 318 can be formed with a small window to facilitate entry of the optical beam $OPT_{BM}$ into the vapor cell 308 and a small window to facilitate exit of the optical beam $OPT_{BM}$ from the vapor cell 308. The reflective coating 318 can thus provide a highly reflective interior surface in contact with an outer surface of the transparent enclosure 310. As a result of the highly reflective interior surface of the reflective coating 318, the fluorescent light 314 resulting from the energy decay of the alkali metal atoms can be reflected within the vapor cell 308, as opposed to being transmissive through the transparent walls of the transparent enclosure 310.

The vapor cell 308 further includes a detection window 320 corresponding to an absence of the reflective coating 318 from a portion of the transparent enclosure 310. Therefore, the detection window 320 corresponds to an aperture through which the fluorescent light 314 can propagate through the transparent enclosure 310 to escape the vapor cell 308. In the example of FIG. 3, the vapor cell detection system 302 further includes a photodetector (e.g., photodiode) 322 that is arranged proximal to the detection window 320 that is configured to receive the fluorescent light 314. While the example of FIG. 3 demonstrates that the photodetector 322 is arranged proximal to the detection window 320, the vapor cell detection system 302 can include optics (e.g., mirrors, lenses, waveguides, etc.) that can collect the fluorescent light 314 from the detection window 320 and direct the fluorescent light 314 to the photodetector 322.

Based on the reflection of the fluorescent light 314 in the interior of the vapor cell 308 via the reflective coating 318, both the direct rays of the fluorescent light 314 and the reflected rays of the fluorescent light 314 can be emitted from the detection window 320. Additionally, because the transparent enclosure 310 is arranged as a cylindrical tube having a round (e.g., circular or oval) cross-section relative to the central longitudinal axis 312. Therefore, the optical beam $OPT_{BM}$ can be arranged to be provided offset from and parallel to the central longitudinal axis 312. As a result, as demonstrated in greater detail in the second view 306 at 324, the rays of the fluorescent light 314 are not in general retroreflected within the vapor cell 308, but instead continue to be reflected in the vapor cell 308 until they are emitted from the detection window 320. Accordingly, most of the fluorescent light 314 that is emitted from the alkali metal atoms (e.g., along a longitudinal length of the detection window 320) can be emitted from the detection window 320 and monitored by the photodetector 322.

Figure 4:
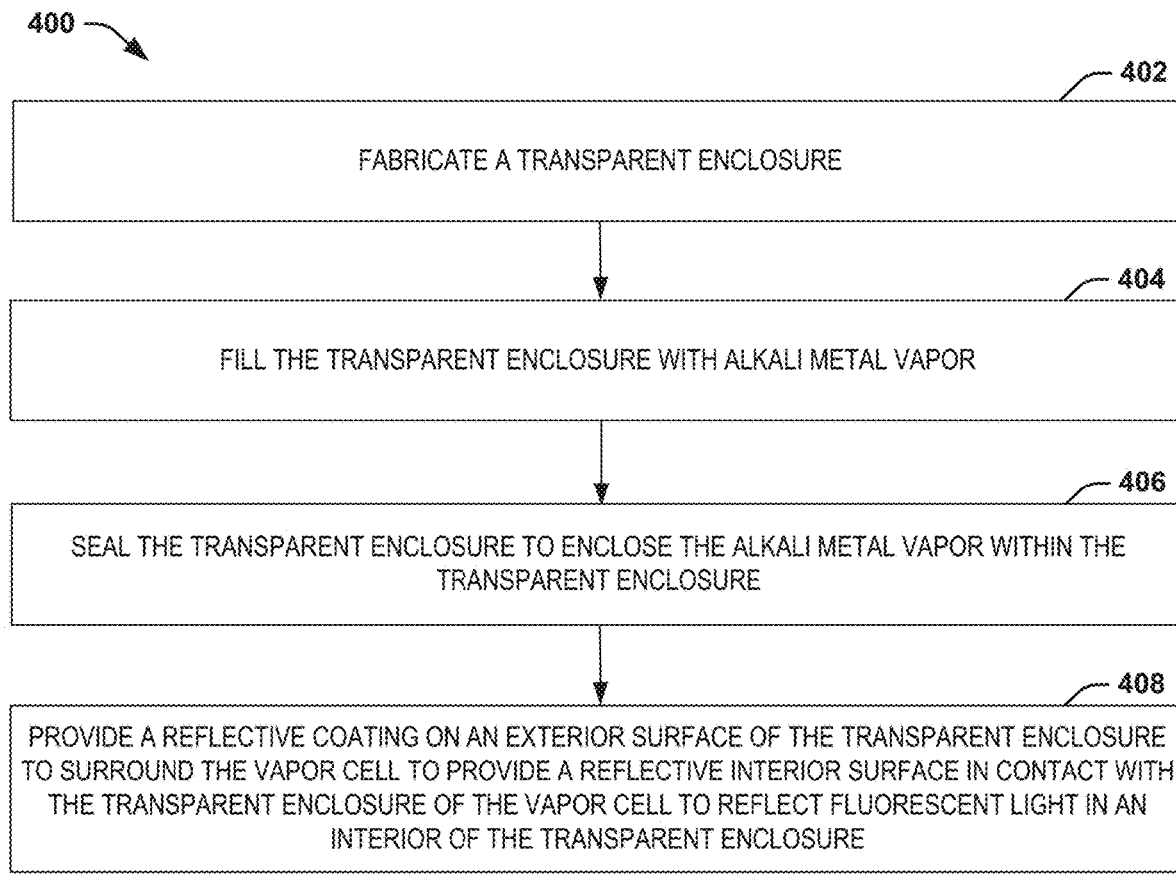
FIG. 4 illustrates an example of a method for forming a vapor cell.

In view of the foregoing structural and functional features described above, a methodology in accordance with various aspects of the disclosure will be better appreciated with reference to FIG. 4. It is to be understood and appreciated that the method for FIG. 4 is not limited by the illustrated order, as some aspects could, in accordance with the present disclosure, occur in different orders and/or concurrently with other aspects from that shown and described herein. Moreover, not all illustrated features may be required to implement a methodology in accordance with an aspect of the present examples.

FIG. 4 illustrates an example of a method 400 for forming a vapor cell (e.g., the vapor cell 102). At 402, a transparent enclosure (e.g., the transparent enclosure 104) is fabricated. At 404, the transparent enclosure is filled with alkali metal vapor. At 406, the transparent enclosure is sealed to enclose the alkali metal vapor within the transparent enclosure. At 408, a reflective coating (e.g., the reflective coating 106) is provided on an exterior surface of the transparent enclosure to surround the vapor cell to provide a reflective interior surface with respect to the transparent enclosure of the vapor cell to reflect fluorescent light in an interior of the transparent enclosure.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A vapor cell comprising:
   a transparent enclosure;
   alkali metal atoms enclosed within the transparent enclosure, the alkali metal atoms being configured to be stimulated from a first energy state to a second energy state in response to an optical beam provided through the vapor cell and to emit fluorescent light in response to energy of the alkali metal atoms decaying from the second energy state to the first energy state; and
   a reflective coating that is provided on an exterior surface of the transparent enclosure to surround the vapor cell to provide a reflective interior surface with respect to the transparent enclosure of the vapor cell to reflect the fluorescent light, the reflective coating comprising a detection window configured to facilitate escape of the fluorescent light from the vapor cell for optical detection.

2. The cell of claim 1, wherein the reflective coating is formed from a dielectric material selected to be transparent to a frequency of the optical beam.

3. The cell of claim 1, wherein the reflective coating is formed from a metallic material, wherein the reflective coating further comprises a window to facilitate entry and exit of the optical beam into and from the transparent enclosure, respectively.

4. The cell of claim 1, wherein the transparent enclosure is arranged as a cylindrical tube having a round cross-section with respect to a central longitudinal axis, wherein the detection window is arranged on a lateral side of the cylindrical tube.

5. A vapor cell detection system comprising the vapor cell of claim 1, the vapor cell detection system further comprising a photodetector arranged to monitor an intensity of the fluorescent light emitted from the detection window.

6. An atomic system comprising the vapor cell detection system of claim 5.

7. The atomic system of claim 6, further comprising:
   a laser configured to generate the optical beam; and
   optics configured to provide the optical beam through the vapor cell.

8. The atomic system of claim 7, wherein the transparent enclosure of the vapor cell is arranged as a cylindrical tube having a round cross-section with respect to a longitudinal central axis, wherein the optics are configured to provide the optical beam through the vapor cell parallel and radially offset from the longitudinal central axis.

9. The atomic system of claim 7, wherein the optics comprise a mirror on a distal end of the vapor cell to reflect the optical beam exiting the vapor cell back through the vapor cell in an antiparallel and collinear manner.

10. A method for forming a vapor cell, the method comprising:
    fabricating a transparent enclosure;
    filling the transparent enclosure with alkali metal vapor;
    sealing the transparent enclosure to enclose the alkali metal vapor within the transparent enclosure; and
    providing a reflective coating on an exterior surface of the transparent enclosure to surround the vapor cell to provide a reflective interior surface with respect to the transparent enclosure of the vapor cell to reflect fluorescent light in an interior of the transparent enclosure.

11. The method of claim 10, wherein providing the reflective coating comprises providing a detection window that is absent the reflective coating, the detection window being configured to facilitate escape of the fluorescent light from the vapor cell for optical detection.

12. The method of claim 11, wherein providing the detection window comprises providing the detection window on a lateral side of the transparent enclosure.

13. The method of claim 10, wherein providing the reflective coating comprises providing a dielectric material as the reflective coating.

14. The method of claim 13, wherein providing the dielectric material comprises providing the dielectric material that is transparent to a frequency of an optical beam that is configured to stimulate the alkali metal vapor from a first energy state to a second energy state.

15. The method of claim 10, wherein fabricating the transparent enclosure comprises fabricating the transparent enclosure as a cylindrical tube having a round cross-section with respect to a central longitudinal axis.

16. An atomic system comprising:
    a laser configured to generate the optical beam;
    a vapor cell comprising:
      a transparent enclosure;
      alkali metal atoms enclosed within the transparent enclosure; and
      a reflective coating that is provided on an exterior surface of the transparent enclosure to surround the vapor cell to provide a reflective interior surface with respect to the transparent enclosure of the vapor cell, the reflective coating comprising a detection window;
    optics configured to provide the optical beam through the vapor cell to stimulate the alkali metal atoms from a first energy state to a second energy state, such that the alkali metal atoms emit fluorescent light in response to energy of the alkali metal atoms decaying from the second energy state to the first energy state, the reflective interior surface being configured to reflect the fluorescent light within the transparent enclosure; and a detection system further comprising a photodetector arranged to monitor an intensity of the fluorescent light escaping the transparent enclosure via the detection window.

17. The system of claim 16, wherein the reflective coating is formed from a dielectric material selected to be transparent to a frequency of the optical beam.

18. The system of claim 16, wherein the reflective coating is formed from a metallic material, wherein the reflective coating further comprises a window to facilitate entry and exit of the optical beam into and from the transparent enclosure, respectively.

19. The system of claim 16, wherein the transparent enclosure is arranged as a cylindrical tube having a round cross-section with respect to a central longitudinal axis, wherein the detection window is arranged on a lateral side of the cylindrical tube, wherein the optics are configured to provide the optical beam through the vapor cell parallel and radially offset from the longitudinal central axis.

20. The system of claim 16, wherein the optics comprise a mirror on a distal end of the vapor cell to reflect the optical beam exiting the vapor cell back through the vapor cell in an antiparallel and collinear manner.

* * * * *